United States Patent
Tharayil Narayanan et al.

(10) Patent No.: US 11,962,315 B2
(45) Date of Patent: Apr. 16, 2024

(54) PHASE-LOCKED LOOP

(71) Applicant: Telefonaktiebolaget LM Ericsson (publ), Stockholm (SE)

(72) Inventors: Aravind Tharayil Narayanan, Lund (SE); Staffan Ek, Lund (SE); Lars Sundström, Lund (SE); Roland Strandberg, Furulund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/916,200

(22) PCT Filed: Mar. 31, 2020

(86) PCT No.: PCT/EP2020/059072
§ 371 (c)(1),
(2) Date: Sep. 30, 2022

(87) PCT Pub. No.: WO2021/197580
PCT Pub. Date: Oct. 7, 2021

(65) Prior Publication Data
US 2023/0179209 A1 Jun. 8, 2023

(51) Int. Cl.
H03L 7/099 (2006.01)
H03B 5/12 (2006.01)
H03L 7/093 (2006.01)

(52) U.S. Cl.
CPC ......... *H03L 7/0992* (2013.01); *H03B 5/1212* (2013.01); *H03L 7/093* (2013.01); *H03B 2201/0208* (2013.01)

(58) Field of Classification Search
CPC .................................................. H03L 7/0992
(Continued)

(56) References Cited

U.S. PATENT DOCUMENTS 6,016,082 A   1/2000   Cruz et al.
7,336,134 B1  2/2008   Janesch et al.
(Continued)

FOREIGN PATENT DOCUMENTS

EP   0902483 B1   11/2008
EP   3416243 A1   12/2018
(Continued)

OTHER PUBLICATIONS

Yun et al. "A 1mW Current-Reuse CMOS Differential LC-VCO with Low Phase Noise" ISSCC 2005 / SESSION 29 / RF Techniques / 29.6, 3 pages.
(Continued)

*Primary Examiner* — Joseph Chang
(74) *Attorney, Agent, or Firm* — Rothwell, Figg, Ernst & Manbeck, P.C.

(57) ABSTRACT

A phase-locked loop comprises a voltage controlled oscillator. The voltage controlled oscillator comprises an inductor and a capacitor, connected in parallel, and also connected in parallel therewith, a negative resistance structure. A first terminal of the negative resistance structure is connected to respective first terminals of the inductor and the capacitor. A second terminal of the negative resistance structure is connected to respective second terminals of the inductor and the capacitor. The negative resistance structure exhibits a tunable capacitance, such that a frequency of an output of the voltage controlled oscillator can be tuned by a control input signal, and the control input signal is generated in the phase-locked loop. The negative resistance structure comprises first and second transistors. There is a first conduction path between the first terminal of the first transistor and the control terminal of the second transistor, and a second conduction path between the control terminal of the first transistor and the first terminal of the second transistor. The (Continued)

control terminal of at least one of the first and second transistors is biased by the control input signal, such that a parasitic capacitance of said at least one of the first and second transistors can be tuned by the control input signal, in order to tune the frequency of the output of the voltage controlled oscillator, and hence the frequency of oscillation of the phase-locked loop.

18 Claims, 9 Drawing Sheets

(58) Field of Classification Search
USPC .................................................. 331/8
See application file for complete search history.

(56) References Cited

U.S. PATENT DOCUMENTS

| 9,787,249 B2 | 10/2017 | Levinger et al. | |
|---|---|---|---|
| 2006/0055477 A1 | 3/2006 | Kang | |
| 2006/0261902 A1* | 11/2006 | Masuda | H03B 5/1215 331/36 C |
| 2010/0295627 A1* | 11/2010 | Okada | H03B 5/1228 331/117 FE |
| 2014/0132359 A1 | 5/2014 | Tagivand | |

FOREIGN PATENT DOCUMENTS

| KR | 20110131641 A | 12/2011 |
|---|---|---|
| WO | 2012112587 A1 | 8/2012 |

OTHER PUBLICATIONS

Kim et al. "A 28-GHz CMOS Direct Conversion Transceiver With Packaged 2×4 Antenna Array for 5G Cellular System" IEEE Journal of Solid-State Circuits, vol. 53, No. 5, May 2018, pp. 1245-1259.
International Search Report and the Written Opinion of the International Searching Authority, issued in corresponding International Application No. PCT/EP2020/059072, dated Dec. 15, 2020, 10 pages.
A. Musa, R. Murakami, T. Sato, W. Chaivipas, K. Okada and A. Matsuzawa, "A Low Phase Noise Quadrature Injection Locked Frequency Synthesizer for MM-Wave Applications," in IEEE Journal of Solid-State Circuits, vol. 46, No. 11, pp. 2635-2649, Nov. 2011. doi: 10.1109/JSSC.2011.2166336.
J. -O. Plouchart et al., "A 243-GHz F/sub t/ and 208-GHz F/sub max/, 90-nm SOI CMOS SoC technology with low-power mm-wave digital and RF circuit capability," in IEEE Transactions on Electron Devices, vol. 52, No. 7, pp. 1370-1375, Jul. 2005. doi: 10.1109/TED.2005.850638.
S. Moghadami, F. Hajilou, P. Agrawal and S. Ardalan, "A 210 GHz Fully-Integrated OOK Transceiver for Short-Range Wireless Chip-to-Chip Communication in 40 nm CMOS Technology," in IEEE Transactions on Terahertz Science and Technology, vol. 5, No. 5, pp. 737-741, Sep. 2015. doi: 10.1109/TTHZ.2015.2459673.
Y. Peng, J. Yin, P. Mak and R. P. Martins, "Low-Phase-Noise Wideband Mode-Switching Quad-Core-Coupled mm-wave VCO Using a Single-Center-Tapped Switched Inductor," in IEEE Journal of Solid-State Circuits, vol. 53, No. 11, pp. 3232-3242, Nov. 2018.
Akhter et al. "A High Figure of Merit Low Power LC VCO for D Band Applications" 2019 22nd International Conference on Computer and Information Technology (ICCIT), Dec. 18-20, 2019 6 pages.

* cited by examiner

PHASE-LOCKED LOOP

CROSS REFERENCE TO RELATED APPLICATION(S)

This application is a 35 U.S.C. § 371 National Phase Entry Application from PCT/EP2020/059072, filed Mar. 31, 2020, designating the United States, the disclosure of which is incorporated herein by reference in its entirety.

TECHNICAL FIELD

Embodiments of the present disclosure relate to a phase-locked loop, and in particular to a phase-locked loop including an oscillator.

BACKGROUND

It is known to provide a phase-locked loop, comprising a voltage controlled oscillator, wherein the voltage controlled oscillator comprises an inductor and a capacitor, connected in parallel, and also comprises a negative resistance structure connected in parallel therewith. It is further known to provide a tunable capacitance in parallel with the negative resistance structure, such that a frequency of an output of the voltage controlled oscillator, and hence a frequency of oscillation of the phase-locked loop, can be tuned by a control input signal.

One way of providing capacitor-based tuning is by using one or more varactor, where the control signal can be applied to the varactor. Varactors are able to achieve very fine frequency resolution, but the quality factor of varactors, a measure related to signal loss per cycle of oscillation when put into a resonant circuit, degrades with increasing frequency, which causes degradation in the phase noise of the oscillator.

SUMMARY

According to a first aspect, there is provided a phase-locked loop, comprising a voltage controlled oscillator. The voltage controlled oscillator comprises an inductor and a capacitor, connected in parallel; and connected in parallel therewith, a negative resistance structure. A first terminal of the negative resistance structure is connected to respective first terminals of the inductor and the capacitor, and a second terminal of the negative resistance structure is connected to respective second terminals of the inductor and the capacitor. The negative resistance structure exhibits a tunable capacitance, such that a frequency of an output of the voltage controlled oscillator can be tuned by a control input signal, and the control input signal is generated in the phase-locked loop. The negative resistance structure comprises first and second transistors, and each of the first and second transistors has a respective transistor conduction path between first and second terminals thereof and has a control terminal. There is a first conduction path between the first terminal of the first transistor and the control terminal of the second transistor, there is a second conduction path between the control terminal of the first transistor and the first terminal of the second transistor, and the control terminal of at least one of the first and second transistors is biased by the control input signal, such that a parasitic capacitance of said at least one of the first and second transistors can be tuned by the control input signal, in order to tune the frequency of the output of the voltage controlled oscillator, and hence the frequency of oscillation of the phase-locked loop.

The negative resistance structure may comprise a plurality of first and second transistors, and the control terminal of each of at least one of the first and second transistors may be biased by the control input signal.

The first and second transistors comprise CMOS devices. More specifically, the first and second transistors may comprise NMOS devices, or may comprise PMOS devices.

One of said first and second transistors may comprise a PMOS device, while another of said first and second transistors comprises an NMOS device.

Said control terminal of said first and second transistors may comprise a gate terminal.

Said first terminal of said first and second transistors may comprise a drain terminal.

The control terminal of both of the first and second transistors may be biased by the control input signal, while the first terminal of both of the first and second transistors is biased by a supply voltage.

The first terminal of both of the first and second transistors may biased by the supply voltage through an impedance. The first terminal of both of the first and second transistors may be biased by the supply voltage through the inductor.

The second terminals of the first and second transistors may be connected to ground, or may be connected to a current source, or may be connected to a tuned impedance.

The control terminal of only one of the first and second transistors may be biased by the control input signal, with the second terminal of said one of the first and second transistors biased by the supply voltage.

A phase of a signal derived from the output of the voltage controlled oscillator may be controlled with a reference signal, and a resulting phase error signal passed to a filter to derive said control input signal of the oscillator.

Said signal derived from the output of the voltage controlled oscillator may be the output of the voltage controlled oscillator.

Said signal derived from the output of the voltage controlled oscillator may be a frequency divided or multiplied version of the output of the voltage controlled oscillator.

This has the advantage that the intrinsic capacitances of the active devices are used for achieving frequency tuning by periodically modulating these capacitances. This does not require the introduction of additional lossy components into the tuned tank network, and therefore helps improve the quality factor of the oscillator and the phase noise performance, especially at higher frequencies, such as mm-wave and THz band. This also helps reduce supply and temperature sensitivity by reducing the number of frequency dependent components in the tank network.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
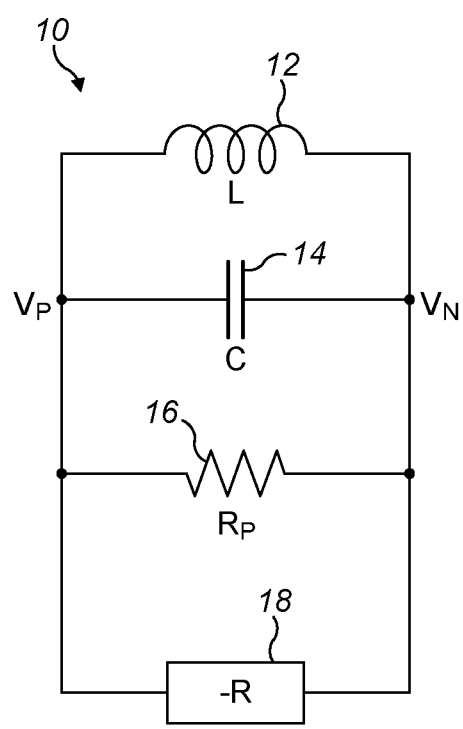
FIG. 1 shows the general form of an oscillator.

FIG. 1 shows the general form of an oscillator 10.

An inductor (L) 12 and a capacitor (C) 14 are connected in parallel to form a tuned tank network, with a voltage $V_P$ at respective first terminals of the inductor 12 and capacitor 14, and a voltage $V_N$ at respective second terminals of the inductor 12 and capacitor 14. The inductance value L and the capacitance value C together determine an approximate frequency of oscillation of the oscillator 10.

Losses in the tuned tank network are represented by a resistor ($R_P$) 16.

A negative resistance (−R) structure 18 is used for compensating for the losses in the tuned tank network, to maintain oscillation in the circuit. Thus, the negative resistance structure 18 is connected in parallel with the inductor 12 and the capacitor 14.

The negative resistance may take the form of active devices in various circuit configurations. The active devices may, for example, be realized with transistors in CMOS technology (which may be (i) PMOS only (ii) NMOS only or (iii) a mixture of PMOS and NMOS devices). Other technologies that may be used include bipolar technology and HEMT (high-electron-mobility transistors based on so called III-V materials). Needless to say, oscillators may be implemented in a vast range of technologies for integrated electronic circuits.

As described in more detail below, in embodiments disclosed herein, the tuned LC oscillator utilizes the intrinsic capacitances of these active devices for achieving frequency tuning by modifying the overall capacitance of the circuit from the capacitance value C mentioned above. More specifically, this is achieved by periodically modulating the capacitances of the active devices.

Figure 2:
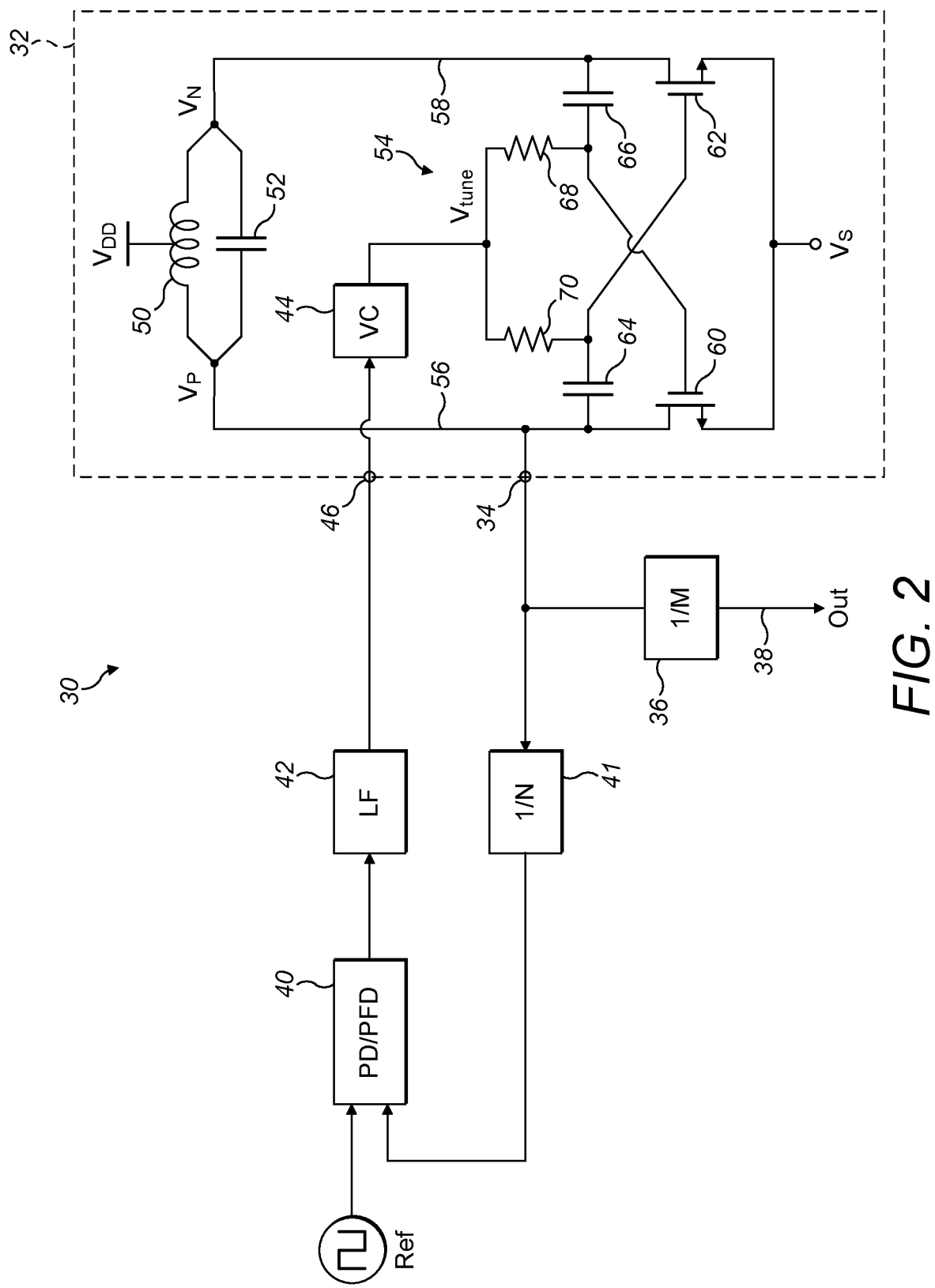
FIG. 2 shows a phase-locked loop in accordance with one embodiment, comprising a controlled oscillator.

FIG. 2 shows the form of a phase-locked loop 30 in accordance with one embodiment.

The phase-locked loop 30 comprises a controlled oscillator 32, which in this embodiment takes the form of a Voltage Controlled Oscillator (VCO).

The oscillator 32 has an output terminal 34, and an output of the oscillator 32 at the output terminal 34 is used as a source for an output signal of the phase locked loop. In this embodiment, the output of the oscillator 32 at the output terminal 34 is passed to a first frequency divider 36, which divides the frequency of the output by an integer or fractional value, M, in order to generate the output signal of the phase locked loop on an output 38.

In principle, a phase-locked loop of this general form may be used to generate an output signal at any desired frequency. However, the form of the oscillator 32 is particularly advantageous when used to generate output signals at high frequencies, for example in the mmWave band (in the region 30 GHz-300 GHz) or even at frequencies in the terahertz band (for example in the region 300 GHz-3 THz, or higher), because it avoids the need to use varactors, whose quality factors typically reduce at higher frequencies.

A signal derived from the output of the voltage controlled oscillator is also passed to a first input of a phase detector (PD), or phase frequency detector (PFD) 40. In this illustrated embodiment, the output of the voltage controlled oscillator 32 is passed to a second frequency divider 41, which divides the frequency of the output by N, in order to generate the signal derived from the output of the voltage controlled oscillator. In another embodiment, there is no frequency division, and the signal derived from the output of the voltage controlled oscillator is the output of the voltage controlled oscillator, which may be buffered before it is applied to the phase detector (PD), or phase frequency detector (PFD) 40.

A reference signal (Ref) is passed to a second input of the phase or phase frequency detector 40, which generates an output signal representing a phase or frequency error between the reference signal and the signal derived from the output of the voltage controlled oscillator 32.

Figure 2A:
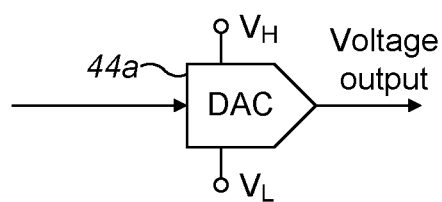
Figure 2B:
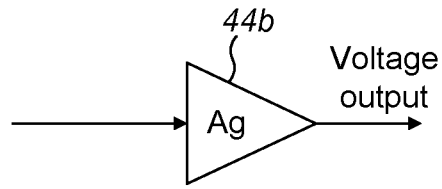

In this embodiment, the phase or frequency error signal is passed to a loop filter (LF) 42, and the filtered phase or frequency error signal is passed to a control input 46 of the controlled oscillator 32 to act as the control input signal of the oscillator. Specifically, the control input signal of the oscillator 32 is passed to a voltage control (VC) block 44. FIG. 2(a) and FIG. 2(b) show more detail of the voltage control block 44.

In the embodiment shown in FIG. 2(a), the loop filter 42 in the phase-locked loop 30 is a digital filter, which provides a digital output signal, which is converted to an analog signal by a digital-analog converter 44a to generate a control voltage output for use in the voltage controlled oscillator 32.

In the embodiment shown in FIG. 2(b), the loop filter 42 in the phase-locked loop 30 is an analog filter, which provides an analog control input signal. In this case, the voltage control block 44 is an amplifier 44b that converts the control input voltage or current signal into a control voltage output for use in the voltage controlled oscillator 32. In still other embodiments, the phase-locked loop is a hybrid phase-locked loop, deriving both digital and analog control signals for the oscillator.

FIG. 2 also shows the form of the voltage controlled oscillator 32, in this embodiment.

Specifically, the oscillator 32 comprises an inductor 50 and a capacitor 52, connected in parallel. Also connected in parallel therewith is a negative resistance structure 54, such that respective first terminals of the negative resistance structure 54 and of the inductor 50 and the capacitor 52 are connected together at a point 56 (with a voltage $V_P$ thereat), and respective second terminals of the negative resistance structure 54 and of the inductor 50 and the capacitor 52 are connected together at a point 58 (with a voltage $V_N$ thereat).

The supply voltage $V_{DD}$ is supplied through a center tap of the inductor 50.

As explained in more detail below, the negative resistance structure 54 exhibits a tunable capacitance, such that a frequency of an output of the voltage controlled oscillator can be tuned by the control input signal 46 (Vtune).

In this embodiment, the negative resistance structure comprises a first transistor 60 and a second transistor 62, realized in CMOS technology, and the first and second transistors 60, 62 are cross-coupled.

That is, the drain of the first transistor 60 is connected to the point 56, and the drain of the second transistor 62 is connected to the point 58. The drain of the first transistor 60 is also connected to the gate of the second transistor 62, through a capacitor 64, and the drain of the second transistor 62 is also connected to the gate of the first transistor 60, through a capacitor 66. The sources of the first transistor 60 and the second transistor 62 are connected together, to a node $V_S$.

Thus, the bias points for the gate terminals of the transistors are isolated from the drain terminals, and are biased with different voltages.

The control input signal ($V_{tune}$) received at the control input terminal 46 is connected to the gate of the first transistor 60 through a respective impedance (which in this illustrated embodiment is a resistor 68) and is connected to the gate of the second transistor 62 through a respective impedance (which in this illustrated embodiment is a resistor 70).

Thus, in this embodiment, the gates of both transistors are biased by the control input signal. The frequency of oscillation of the oscillator circuit 32 can then be tuned by modulating the capacitances in the transistors by changing the bias point of the devices.

This means that the frequency tuning can be achieved without introducing any lossy components into the LC tank of the oscillator, which means that the quality factor is not degraded. Similarly, frequency tuning can be achieved without introducing additional frequency dependent components into the oscillator, thereby reducing the supply and temperature sensitivity. In addition, this is capable of producing very fine frequency tuning steps, because very fine modulation of the device capacitance can be achieved.

Figure 3:
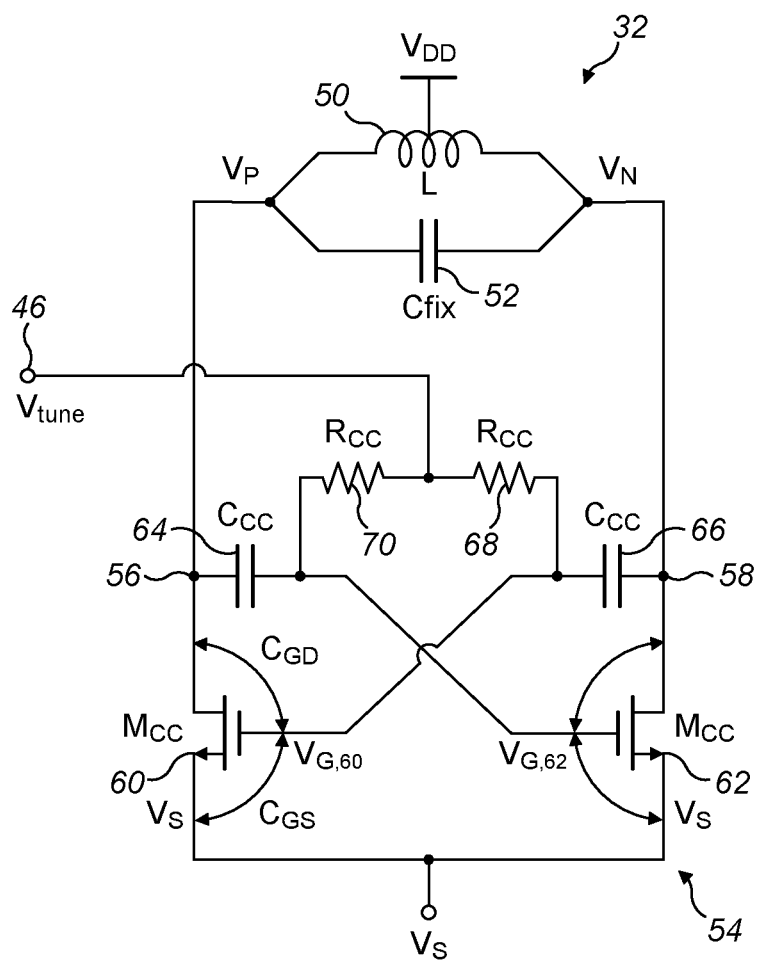
FIG. 3 shows an alternative form of controlled oscillator.

FIG. 3 shows in more detail the form of the voltage controlled oscillator 32 shown in FIG. 2. Components of the voltage controlled oscillator 32 shown in FIG. 3 are indicated by the same reference numerals as the components of the voltage controlled oscillator 32 shown in FIG. 2.

FIG. 3 also shows the voltages $V_G$ at the gates of the transistors 60, 62, and the voltages $V_S$ at the sources of the transistors 60, 62.

FIG. 3 also shows the intrinsic device capacitances $C_{GD}$ and $C_{GS}$ that exist between the gate and the drain, and between the gate and the source, respectively, of the transistors 60, 62.

It is the capacitances $C_{GD}$ and $C_{GS}$ that are modulated by the voltages $V_{G,60}$ and $V_{G,62}$ at the gates of the transistors 60, 62, in response to the control input signal $V_{tune}$ on the control input terminal 46, in order to adjust the overall capacitance of the circuit, and hence adjust the oscillation frequency of the oscillator 32.

FIG. 3 shows one specific example of an oscillator circuit, but it will be appreciated that the same technique is extendable to other LC oscillator structures such as PMOS type, Complementary MOS (PMOS and NMOS) type, and current re-use type, etc. While FIGS. 2 and 3 show the sources of the transistors 60, 62 connected together, there are oscillator circuits where this is not true, for example split tuned oscillators and gm enhanced oscillators, and oscillators with periodic tail biasing, as well as transformer biased class-C oscillators. The negative resistance can also be realized in bipolar technology as well as in CMOS technology.

The oscillator 32 can also be used in various modes of VCO operation, such as class-B, class-C, dual-conduction, etc.

Figure 4:
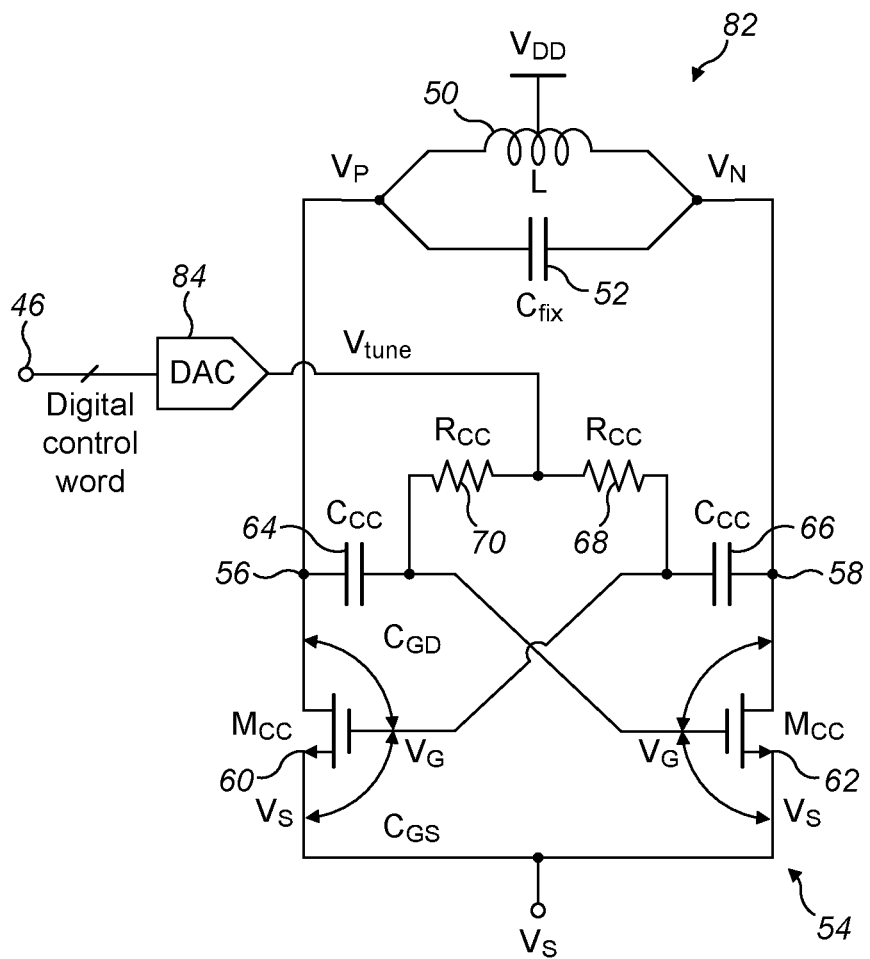
FIG. 4 shows a further alternative form of controlled oscillator.

FIG. 4 shows a slightly modified form of voltage controlled oscillator 82. Components of the voltage controlled oscillator 82 shown in FIG. 4 are indicated by the same reference numerals as the components of the voltage controlled oscillator 32 shown in FIG. 3.

FIG. 3 shows an embodiment in which the control signal $V_{tune}$ that is applied to bias the capacitances $C_{GD}$ and $C_{GS}$ is an analog voltage that is received on the control input terminal 46 from an external analog source. In the case of an analog PLL, this may be the loop filter output voltage. In the case of a digital or hybrid PLL, with a digital loop filter, the output of the digital loop filter may be applied to a digital-to-analog converter, such as the digital-to-analog converter 44 shown in FIG. 2, in order to generate an analog voltage that is received on the control input terminal 46 of the oscillator 32.

By contrast, FIG. 4 shows an embodiment in which the input that is received on the control input terminal 46 of the oscillator 82 is a digital control word, which may for example be received directly from the digital loop filter in a digital or hybrid PLL.

This digital control word is applied to a digital-to-analog converter 84, in order to generate an analog control signal $V_{tune}$ that is applied to the gate terminals of the transistors 60, 62, in order to bias the capacitances $C_{GD}$ and $C_{GS}$.

Figure 5:
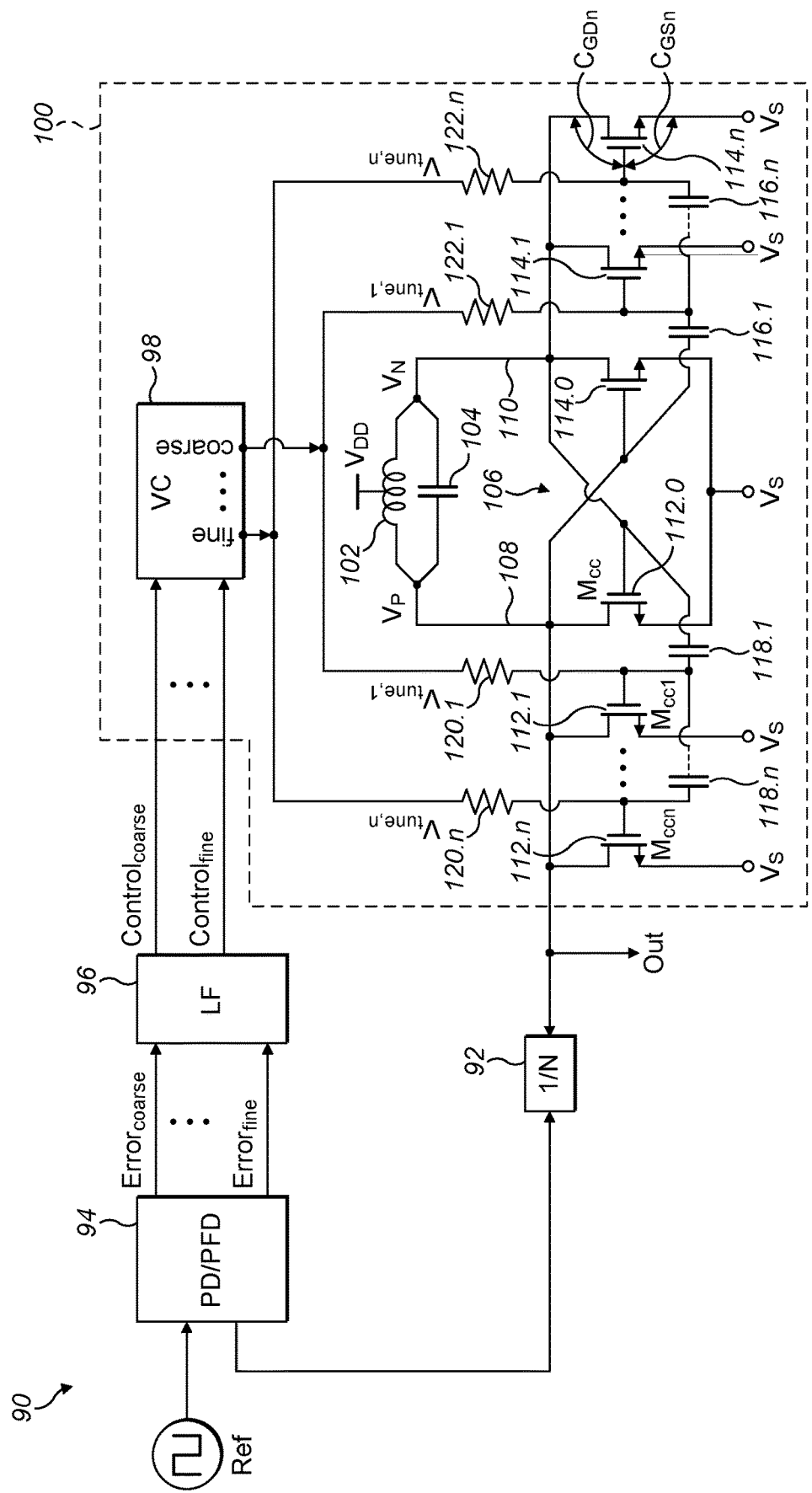
FIG. 5 shows a phase-locked loop in accordance with another embodiment, including a further alternative form of controlled oscillator.

FIG. 5 shows a phase-locked loop including a further alternative form of voltage controlled oscillator, in which different tuning ranges are achieved by splitting up the total required negative resistance into smaller cells. Again, this principle can be applied to other oscillator structures, such as push-pull (CMOS) oscillators, PMOS oscillators, class-C oscillators, Class-B oscillators, and Class AB oscillators, etc.

Specifically, FIG. 5 shows a phase-locked loop 90, including a voltage controlled oscillator 100. As generally described with reference to FIG. 2, an output of the oscillator 100 is applied to a frequency divider (1/N) 92, with the output of the frequency divider 92 and a reference signal being applied to the inputs of a phase detector (PD) or phase/frequency detector (PFD) 94. In this embodiment, the PFD 94 generates an error signal that can be considered as comprising multiple parts, $error_{coarse}$, . . . , $error_{fine}$. For example, in the case of a digital signal, these may be the different bits of the signal.

For example, the most significant bits may represent the coarse error, while the least significant bits represent the fine error, etc.

The error signal is passed to a loop filter 96, which again may generate a control signal that can be considered as comprising multiple parts, $Control_{coarse}$, . . . , $Control_{fine}$. For example, in the case of a digital signal, these may be the different bits of the signal. For example, the most significant bits may be used for the coarse frequency control, while the least significant bits may be used for the fine frequency control, etc.

However, the control signals may be analog, or they may be digital, or they may be a combination of analog and digital. For example $Control_{coarse}$ and $Control_{fine}$ may both be digital or may both be analog, or $Control_{coarse}$ may be digital while $Control_{fine}$ is analog, etc.

The control signal is passed to a voltage control block 98, as described with reference to FIG. 2.

The oscillator 100 comprises an inductor 102 and a capacitor 104, connected in parallel. Also connected in parallel therewith is a negative resistance structure 106, such that respective first terminals of the negative resistance structure 106 and of the inductor 102 and the capacitor 104 are connected together at a point 108 (with a voltage $V_P$ thereat), and respective second terminals of the negative resistance structure 106 and of the inductor 102 and the capacitor 104 are connected together at a point 110 (with a voltage $V_N$ thereat).

The supply voltage $V_{DD}$ is supplied through a center tap of the inductor 102.

As in earlier embodiments, the negative resistance structure 106 exhibits a tunable capacitance, such that a frequency of an output of the voltage controlled oscillator can be tuned by the control input signal.

In this embodiment, the negative resistance structure comprises multiple pairs of transistors, with the first pair of transistors comprising a first transistor 112.0 and a second transistor 114.0.

These transistors 112.0, 114.0 are cross-coupled. That is, the drain of the first transistor 112.0 is connected to the point 108, and the drain of the second transistor 114.0 is connected to the point 110. The drain of the first transistor 112.0 is also connected to the gate of the second transistor 114.0, and the drain of the second transistor 114.0 is also connected to the gate of the first transistor 112.0. The sources of the first transistor 112.0 and the second transistor 114.0 are connected together, to a node $V_S$. The node $V_S$ can alternatively either be grounded, for example through an impedance, or connected to a constant current source.

The second pair of transistors of the negative resistance structure 106 is a first tuning pair, which comprises a first transistor 112.1 and a second transistor 114.1.

The drain of the first transistor of the first tuning pair 112.1 is connected to the point 108, and the drain of the second transistor of the first tuning pair 114.1 is connected to the point 110. The drain of the first transistor of the first tuning pair 112.1 is also connected to the gate of the second transistor of the first tuning pair 114.1 through a capacitor 116.1, and the drain of the second transistor of the first tuning pair 114.1 is also connected to the gate of the first transistor of the first tuning pair 112.1 though a capacitor 118.1. The sources of the first and second transistors of the first tuning pair 112.1 114.1 are also connected to the node $V_{CC}$.

Similarly, the nth tuning pair of transistors of the negative resistance structure 106 comprises a first transistor 112.n and a second transistor 114.n.

The drain of the first transistor of the nth tuning pair 112.n is connected to the point 108, and the drain of the second transistor of the nth tuning pair 114.n is connected to the point 110. The drain of the first transistor of the nth tuning pair 112.n is also connected to the gate of the second transistor of the nth tuning pair 114.n through a capacitor 116.n, and the drain of the second transistor of the nth tuning pair 114.n is also connected to the gate of the first transistor of the nth tuning pair 112.n though a capacitor 118.n. The sources of the first and second transistors of the nth tuning pair 112.n, 114.n are also connected to the node $V_{CC}$.

In this embodiment, the negative resistance structure, comprising the multiple pairs of transistors, provides the total negative resistance that is required to ensure sustained oscillations in the oscillator circuit, and the parts of the capacitance can be modulated separately.

The sizes of the individual transistors enable frequency tuning with various step sizes. Thus, FIG. 5 shows the transistors of the first tuning pair 112.1, 114.1 having a size $M_{CC1}=\alpha_1 M_{CC}$. Similarly, the transistors of the second tuning pair 112.2, 114.2 have a size $M_{CC2}=\alpha_2 M_{CC}$, and so on, until the transistors of the nth tuning pair 112.n, 114.n have a size $M_{CCn}=\alpha_n M_{CC}$, such that the capacitances that exist between the gate and the drain, and between the gate and the source, respectively, of the transistors are given by $C_{GDn}$ and $C_{GSn}$.

Again, these device capacitances of the active devices that are used as the negative resistance can be modulated in order to tune the oscillator 100.

Specifically, the control input is divided into sections, with a first part of the control input $V_{tune,1}$ being applied to the gates of the transistors 112.1, 114.1 of the first tuning pair through respective resistors 120.1. 122.1, and so on, until a final (nth) part of the control input $V_{tune,n}$ is applied to the gates of the transistors 112.n, 114.n of the nth tuning pair through respective resistors 120.n. 122.n.

Thus, the control input signal can be divided into sections, with each section biasing a different pair of transistors and producing a separate effect on the total capacitance, and hence on the frequency of oscillation. These effects are combined in order to produce the total tuning effect.

Thus, for example a segmented PD/PFD 94 may be used, where control signals for different sizes of phase error are separated. For large phase errors, Vbias1 is generated, which causes the first part of the control input $V_{tune,1}$ to be applied to the gates of the transistors 112.1, 114.1 of the first tuning pair, thus acting as coarse frequency tuning. For a medium phase error, Vbias2 is generated by the PD/PFD 94 and the loop filter 94. This causes a control input to be applied to the gates of the transistors of an intermediate pair of transistors. For small phase errors the PD/PFD 94 and loop filter 96 generates Vbias3, which causes the nth part of the control input $V_{tune,n}$ to be applied to the gates of the transistors 112.n, 114.n of the nth tuning pair, and therefore provides fine tuning of the capacitance and hence of the frequency of the oscillator. This can be extended to achieve a wide range of frequency resolution.

Figure 6:
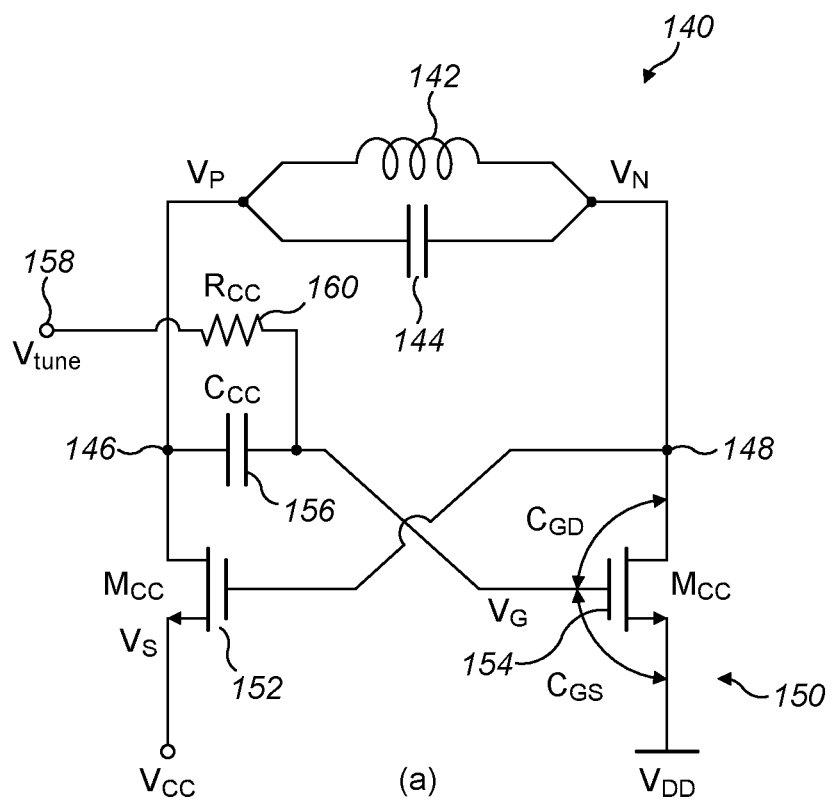
FIG. 6 shows a further alternative form of controlled oscillator.

FIG. 6 shows a further alternative form of voltage controlled oscillator. Specifically, while previous embodiments have used pairs of PMOS transistors, and while equivalent embodiments use pairs of NMOS transistors, FIG. 6 shows a current re-use voltage-controlled oscillator. In such a structure, both transistors can be controlled. However, FIG. 6 shows an example, where only one of the transistors is biased by the control input.

The oscillator 140 comprises an inductor 142 and a capacitor 144, connected in parallel. Also connected in parallel therewith is a negative resistance structure 150, such that respective first terminals of the negative resistance structure 150 and of the inductor 142 and the capacitor 144 are connected together at a point 146 (with a voltage $V_P$ thereat), and respective second terminals of the negative resistance structure 150 and of the inductor 142 and the capacitor 144 are connected together at a point 148 (with a voltage $V_N$ thereat).

As before, the negative resistance structure 150 exhibits a tunable capacitance, such that a frequency of an output of the voltage controlled oscillator can be tuned by the control input signal.

In this embodiment, the negative resistance structure 150 comprises a first transistor 152, which is an NMOS transistor, and a second transistor 154, which is a PMOS transistor.

The first and second transistors 152, 154 are cross-coupled. That is, the drain of the first transistor 152 is connected to the point 146, and the drain of the second transistor 154 is connected to the point 148. The drain of the first transistor 152 is also connected to the gate of the second transistor 154, through a capacitor 156, and the drain of the second transistor 154 is also connected to the gate of the first transistor 152.

The source of the first transistor 152 is connected to a node $V_{CC}$, while the source of the second transistor 154 is connected to a supply voltage $V_{DD}$.

Thus, the bias point for the gate terminal of the transistor 154 is isolated from the drain terminal of transistor 152, and is biased with a different voltage.

A control input signal ($V_{tune}$) received at a control input terminal 158 is connected to the gate of the second transistor 154 through a resistor 160.

Thus, in this embodiment, the gate of just one of the transistors, namely the PMOS transistor 154, is biased by the control input signal. The frequency of oscillation of the oscillator circuit 140 can then be tuned by modulating the capacitances in the transistor 154 by changing the bias point of the device. Specifically, FIG. 6 shows the capacitances $C_{GD}$ and $C_{GS}$ that exist between the gate and the drain, and between the gate and the source, respectively, of the transistor 154.

It is the capacitances $C_{GD}$ and $C_{GS}$ that are modulated by the voltage $V_G$ at the gate of the transistor 154, in response to the control input signal $V_{tune}$ on the control input terminal 158, in order to adjust the overall capacitance of the circuit, and hence adjust the oscillation frequency of the oscillator 140.

Figure 7:
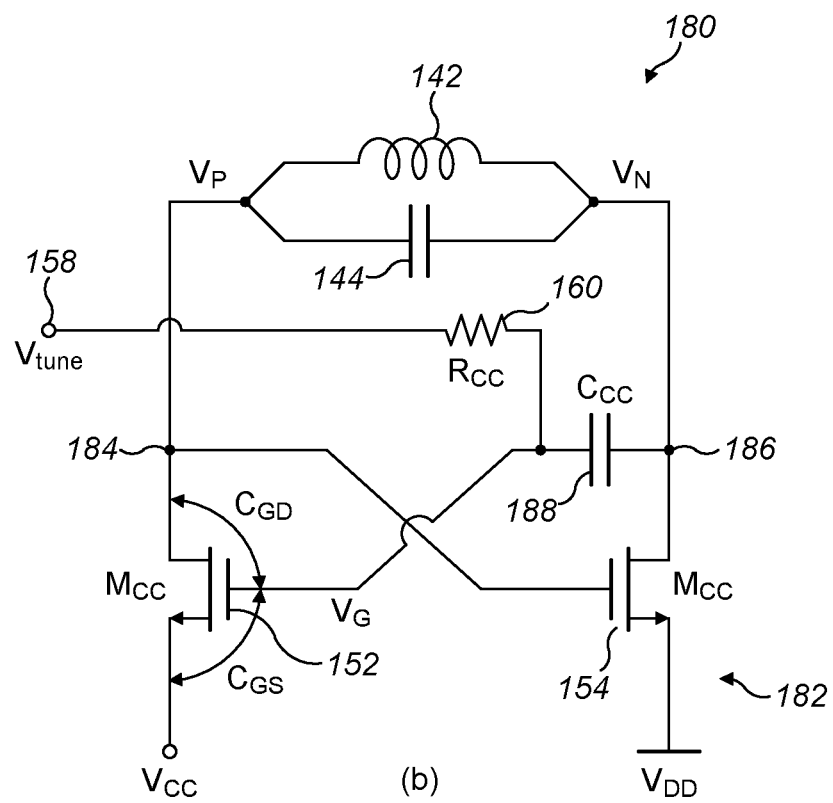
FIG. 7 shows a further alternative form of controlled oscillator.

FIG. 7 shows a further alternative form of voltage controlled oscillator. Specifically, FIG. 7 shows an alternative form of current re-use voltage-controlled oscillator 180. Features of the oscillator 180 that correspond to features of the oscillator 140 shown in FIG. 6 are indicated by the same reference numerals.

Thus, the oscillator 180 comprises an inductor 142 and a capacitor 144, connected in parallel. Also connected in parallel therewith is a negative resistance structure 182, such that respective first terminals of the negative resistance structure 182 and of the inductor 142 and the capacitor 144 are connected together at a point 184 (with a voltage $V_P$ thereat), and respective second terminals of the negative resistance structure 182 and of the inductor 142 and the capacitor 144 are connected together at a point 186 (with a voltage $V_N$ thereat).

As before, the negative resistance structure 182 exhibits a tunable capacitance, such that a frequency of an output of the voltage controlled oscillator can be tuned by the control input signal.

In this embodiment, the negative resistance structure 182 comprises a first transistor 152, which is an NMOS transistor, and a second transistor 154, which is a PMOS transistor.

The first and second transistors 152, 154 are cross-coupled. That is, the drain of the first transistor 152 is connected to the point 184, and the drain of the second transistor 154 is connected to the point 186. The drain of the first transistor 152 is also connected to the gate of the second transistor 154, and the drain of the second transistor 154 is also connected to the gate of the first transistor 152 through a capacitor 188.

The source of the first transistor 152 is connected to a voltage $V_{CC}$, while the source of the second transistor 154 is connected to a supply voltage $V_{DD}$.

Thus, the bias point for the gate terminal of the transistor 152 is isolated from the drain terminal, and is biased with a different voltage.

A control input signal ($V_{tune}$) received at a control input terminal 158 is connected to the gate of the first transistor 152 through a resistor 190.

Thus, in this embodiment, the gate of just one of the transistors, in this embodiment namely the NMOS transistor 152, is biased by the control input signal. The frequency of oscillation of the oscillator circuit 180 can then be tuned by modulating the capacitances in the transistor 152 by changing the bias point of the device. Specifically, FIG. 7 shows the capacitances $C_{GD}$ and $C_{GS}$ that exist between the gate and the drain, and between the gate and the source, respectively, of the transistor 152.

It is the capacitances $C_{GD}$ and $C_{GS}$ that are modulated by the voltage $V_G$ at the gate of the transistor 152, in response to the control input signal $V_{tune}$ on the control input terminal 158, in order to adjust the overall capacitance of the circuit, and hence adjust the oscillation frequency of the oscillator 180.

FIG. 8 is a diagram provided to give a qualitative explanation of the physical process behind the embodiments described herein.

Thus, FIG. 8 shows how the parasitic capacitances $C_{GD}$ and $C_{GS}$ of an active device, such as the transistors used in the oscillators described previously, exhibit non-linear characteristics.

Specifically, FIG. 8 shows the effect of modulating the device capacitance by isolated biasing of the gate and drain terminals. In an oscillator, as illustrated in previous Figures, the respective voltages at the drain and gate terminals can be written as:

$$V_D = V_{DD} + A_t \cos(\phi), \text{ and}$$

$$V_G = V_{tune} - A_t \cos(\phi),$$

where, $V_{DD}$ is the supply voltage, $V_{tune}$ is the tuning voltage, $\phi$ is the phase of oscillation, and $A_t$ is the amplitude of oscillation. $A_t$ is set by the oscillator current and the tank impedance, and has an upper bound of $2V_{DD}$ in the case of NMOS/PMOS type oscillators (as shown in FIGS. 2, 3, 4, and 5) or $V_{DD}$ in case of push-pull type oscillators using complementary type MOS, i.e. both PMOS and NMOS (as shown in FIGS. 6 and 7).

Figure 8A:
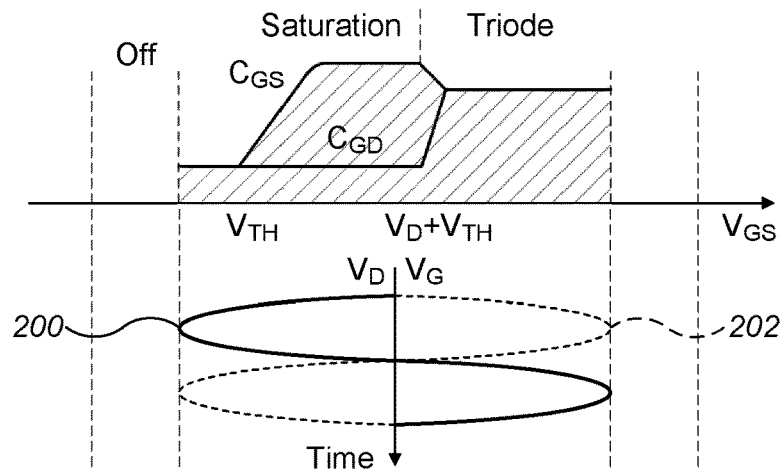
FIG. 8 illustrates an operation of the controlled oscillators illustrated herein.

FIG. 8(a) shows how the parasitic capacitances $C_{GD}$ and $C_{GS}$ vary with the gate voltage level. The lines 200, 202 also show how the gate and drain voltage levels for one of the transistors vary with time during the course of one oscillation.

Since an oscillator follows large signal operation, it can thus be seen from FIG. 8 that, during its operation, the transistors in the oscillator traverse through different regions of operation, i.e. the cut-off, saturation and triode regions. The effective capacitance that is seen by the tuned tank is a weighted average of the integrated capacitance vs voltage characteristic, presented by it over one period of its oscillation.

Thus, the effective capacitance that is seen can be varied, by altering the amount of time that the device spends in each region.

FIG. 8(a) shows the situation where the gate and drain are biased at same potential, that is, $V_G = V_D$. The transistor passes through all the regions of operation, generating an equivalent capacitance of C1.

Figure 8B:
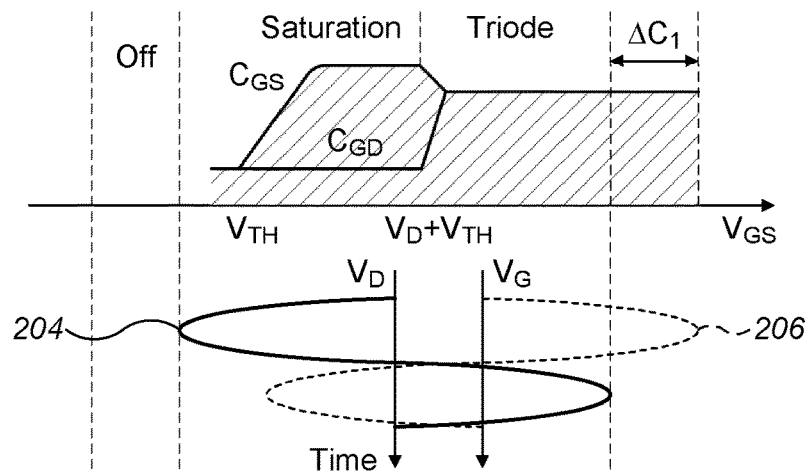

FIG. 8(b) shows the situation where the gate is biased to a higher potential than the drain. In this case, the lines 204, 206 show how the gate and drain voltage levels vary with time during the course of one period of its oscillation.

In this situation, FIG. 8(b) shows that the transistors spend a larger proportion of each oscillation period in the triode region as compared to FIG. 8(a), resulting in a slightly higher capacitance C2, where $C2 - C1 = \Delta C_1$.

Figure 8C:
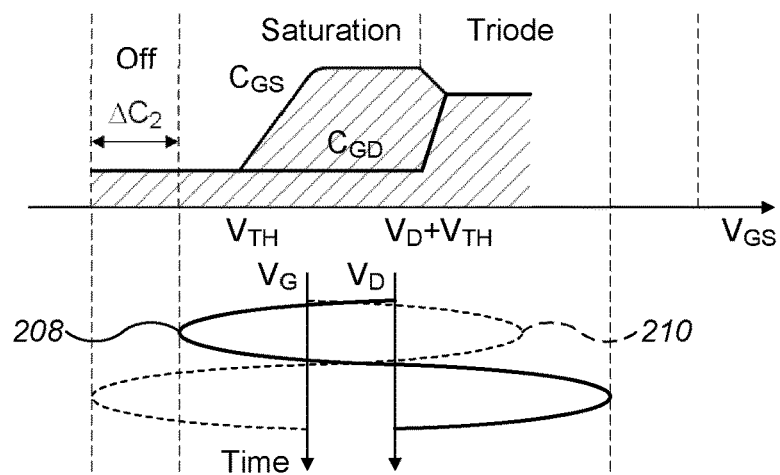

FIG. 8(c) shows the situation where the gate is biased to a lower potential than the drain. In this case, the lines 208, 210 show how the gate and drain voltage levels vary with time during the course of one oscillation.

In this situation, FIG. 8(c) shows that the transistors spend a larger proportion of each oscillation period in the cut-off region as compared to FIG. 8(a), resulting in a slightly lower capacitance C3, where $C1 - C3 = \Delta C_2$.

There is thus described a phase-locked loop, which allows the output frequency generated by an oscillator to be fine tuned, without requiring the use of lossy or frequency dependent components.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A phase-locked loop, comprising a voltage controlled oscillator, wherein the voltage controlled oscillator comprises:
   an inductor and a capacitor, connected in parallel; and
   connected in parallel therewith, a negative resistance structure, wherein a first terminal of the negative resistance structure is connected to respective first terminals of the inductor and the capacitor, wherein a second terminal of the negative resistance structure is connected to respective second terminals of the inductor and the capacitor, wherein the negative resistance structure exhibits a tunable capacitance, wherein a frequency of an output of the voltage controlled oscillator can be tuned by a control input signal, and wherein said control input signal is generated in the phase-locked loop;
   wherein the negative resistance structure comprises first and second transistors, and wherein each of the first and second transistors has a respective transistor conduction path between first and second terminals thereof and has a control terminal;
   wherein there is a first conduction path between the first terminal of the first transistor and the control terminal of the second transistor, wherein there is a second conduction path between the control terminal of the first transistor and the first terminal of the second transistor, and wherein the control terminal of at least one of the first and second transistors is biased by the control input signal; and
   wherein a parasitic capacitance of said at least one of the first and second transistors can be tuned by the control input signal, in order to tune the frequency of the output of the voltage controlled oscillator, and the frequency of oscillation of the phase-locked loop.

2. A phase-locked loop according to claim 1,
   wherein the negative resistance structure comprises a plurality of first and second transistors;
   wherein the control terminal of each of at least one of the first and second transistors is biased by the control input signal.

3. A phase-locked loop according to claim 1,
   wherein the first and second transistors comprise CMOS devices.

4. A phase-locked loop according to claim 3,
   wherein the first and second transistors comprise NMOS devices.

5. A phase-locked loop according to claim 3,
   wherein the first and second transistors comprise PMOS devices.

6. A phase-locked loop according to claim 3,
   wherein one of said first and second transistors comprises a PMOS device, and another of said first and second transistors comprises an NMOS device.

7. A phase-locked loop according to claim 3
   wherein said control terminal of said first and second transistors comprises a gate terminal.

8. A phase-locked loop according to claim 3,
   wherein said first terminal of said first and second transistors comprises a drain terminal.

9. A phase-locked loop according to claim 1,
   wherein the control terminal of both of the first and second transistors is biased by the control input signal; and
   wherein the first terminal of both of the first and second transistors is biased by a supply voltage.

10. A phase-locked loop according to claim 9,
    wherein the first terminal of both of the first and second transistors is biased by the supply voltage through an impedance.

11. A phase-locked loop according to claim 10,
    wherein the first terminal of both of the first and second transistors is biased by the supply voltage through the inductor.

12. A phase-locked loop according to claim 9,
    wherein the second terminals of the first and second transistors are connected to ground.

13. A phase-locked loop according to claim 9,
    wherein the second terminals of the first and second transistors are connected to a current source.

14. A phase-locked loop according to claim 9,
    wherein the second terminals of the first and second transistors are connected to a tuned impedance.

15. A phase-locked loop according to claim 1,
    wherein the control terminal of only one of the first and second transistors is biased by the control input signal; and
    wherein the second terminal of said one of the first and second transistors is biased by the supply voltage.

16. A phase-locked loop according to claim 1, wherein a phase of a signal derived from the output of the voltage controlled oscillator is compared with a reference signal, and a resulting phase error signal is passed to a filter to derive said control input signal of the oscillator.

17. A phase-locked loop according to claim 16, wherein said signal derived from the output of the voltage controlled oscillator is the output of the voltage controlled oscillator.

18. A phase-locked loop according to claim 16, wherein said signal derived from the output of the voltage controlled oscillator is a frequency divided or multiplied version of the output of the voltage controlled oscillator.

* * * * *